(12) United States Patent
Xue et al.

(10) Patent No.: US 11,176,891 B1
(45) Date of Patent: Nov. 16, 2021

(54) GOA CIRCUIT AND ARRAY SUBSTRATE

(71) Applicant: SHENZHEN CHINA STAR OPTOELECTRONICS SEMICONDUCTOR DISPLAY TECHNOLOGY CO., LTD., Shenzhen (CN)

(72) Inventors: Yan Xue, Shenzhen (CN); Baixiang Han, Shenzhen (CN)

(*) Notice: Subject to any disclaimer, the term of this patent is extended or adjusted under 35 U.S.C. 154(b) by 221 days.

(21) Appl. No.: 16/616,504

(22) PCT Filed: Nov. 4, 2019

(86) PCT No.: PCT/CN2019/115296
§ 371 (c)(1),
(2) Date: Nov. 25, 2019

(87) PCT Pub. No.: WO2020/238013
PCT Pub. Date: Dec. 3, 2020

(30) Foreign Application Priority Data

May 24, 2019 (CN) .......................... 201910441673.3

(51) Int. Cl.
*G09G 3/3266* (2016.01)
(52) U.S. Cl.
CPC ... *G09G 3/3266* (2013.01); *G09G 2300/0408* (2013.01); *G09G 2310/0286* (2013.01)
(58) Field of Classification Search
CPC ......... G09G 3/3266; G09G 2300/0408; G09G 2310/0286; G09G 2320/0233; G09G 2320/045; G09G 2320/026; H01L 27/1251
See application file for complete search history.

(56) References Cited

U.S. PATENT DOCUMENTS

| 2007/0063933 | A1* | 3/2007 | Chung | G09G 3/3266 345/76 |
| 2008/0187089 | A1* | 8/2008 | Miyayama | G11C 19/28 377/79 |
| 2011/0074498 | A1* | 3/2011 | Thompson | H01L 21/823807 327/543 |
| 2015/0077319 | A1* | 3/2015 | Yao | G09G 3/20 345/100 |
| 2015/0236161 | A1* | 8/2015 | Takeuchi | H01L 29/78648 257/43 |
| 2015/0269879 | A1* | 9/2015 | Shang | G09G 3/20 345/215 |
| 2017/0061915 | A1* | 3/2017 | Dai | G09G 3/3696 |
| 2018/0190197 | A1* | 7/2018 | Chang | G09G 3/3233 |
| 2019/0066596 | A1 | 2/2019 | Xue et al. | |
| 2019/0285930 | A1 | 9/2019 | Chen et al. | |

FOREIGN PATENT DOCUMENTS

| CN | 103927965 A | 7/2014 |
| CN | 104409055 A | 3/2015 |
| CN | 107393473 A | 11/2017 |
| CN | 108492789 A | 9/2018 |

* cited by examiner

Primary Examiner — Michael J Eurice

(57) ABSTRACT

The present disclosure discloses a gate on array (GOA) circuit and an array substrate. The GOA circuit utilizes a dual gate TFT as a circuit switch. The bottom gate is connected to an external voltage for adjusting the threshold voltages of the TFTs. The stability of the GOA circuit is ensured. The GOA circuit only disposes 6 TFTs. the structure is simpler, and the narrower panel bezel is implemented.

20 Claims, 4 Drawing Sheets

GOA CIRCUIT AND ARRAY SUBSTRATE

FIELD OF INVENTION

The present disclosure relates to files of display driving technologies, particularly to a gate on array (GOA) circuit and an array substrate including the GOA circuit.

BACKGROUND OF INVENTION

Horizontal scanning lines of present active-matrix organic light-emitting diode (AMOLED) display panels are driven by external integrated circuits (ICs). The external integrated circuit can control each stage of scan lines to be sequentially turned on. Line scan driving circuit can be intergrade on the display panel substrate if gate driver on array (GOA) technology is adopted. Therefore, number of external ICs is decreased, manufacturing cost of display panel is reduced, and bezels of display device are narrower. Indium gallium zinc oxide (IGZO) possesses high carrier mobility and good stability, thus are widely used in IGZO GOA circuits.

In manufacturing of IGZO thin film transistors (TFTs), variations during manufacture affect uniformity of threshold voltage Vth of the entire panel. In addition, IGZO-TFT is disturbed by external conditions such as variations of voltage, illumination, and temperature, etc., thus the threshold voltage Vth of device may drift. In order to ensure that the GOA can work normally even the threshold voltage Vth is unevenness or various, sub-circuits are required to be disposed in the IGZO-GOA circuit. Designs of each stages of IGZO-GOA is complicated, and the number of TFTs is plenty (usually more than 20) so that narrower bezel is more difficultly to be achieved. This violates the original purpose of the GOA circuit.

TECHNICAL PROBLEM

In IGZO-TFT manufacture, variations during manufacture affect the uniformity of threshold voltage Vth of the entire panel. In addition, IGZO-TFT is disturbed by external conditions such as variations of voltage, illumination, and temperature, etc., thus the threshold voltage Vth of device may drift.

SUMMARY OF INVENTION

To solve the above-mentioned problems, the technical solutions are as following.

The present disclosure provides a gate on array (GOA) circuit includes plurality of GOA unit, wherein each of the GOA unit including:

A pull-up control circuit configured to receive a scan driving signal of a previous GOA unit and configured to output a switch control signal, wherein the pull-up control circuit comprises a pull-up control switch.

A pull-up circuit configured to receive the switch control signal and configured to output a scan driving signal of a present GOA unit according to the switch control signal, wherein the pull-up circuit comprises a pull-up switch.

A pull-down circuit configured to receive a pull-down control signal and configured to pull-down a voltage potential of the scan driving signal of the present GOA unit to a low voltage potential, wherein the pull-down circuit comprises a first pull-down switch and a second pull-down switch.

An inverter comprising a first thin-film transistor (TFT) and a second TFT, a voltage potential of an output signal of the inverter is inversed of a voltage potential of an input signal of the inverter.

A bootstrap capacitor configured to pull-up and maintain a voltage potential of the switch control signal.

Wherein some of or all of the TFTs in the pull-up control circuit, in the pull-up circuit, in the pull-down circuit, and in the inverter are dual gate TFTs, and a bottom gate of the dual gate TFT is connected to an external voltage for controlling a threshold voltage of the dual gate TFT.

When a some of the TFTs are the dual gate TFTs, the pull-up control switch, the pull-up switch, the first pull-down switch, the second pull-down switch, and the first TFT each are the dual gate TFTs.

In an embodiment of the present disclosure, a ratio of a width of the first TFT to a length of the first TFT is larger than a ratio of width of the second TFT to a length of the second TFT.

In an embodiment of the present disclosure, a control end of the first TFT is an input end of the inverter, an output end of the first TFT, and an output end of the second TFT are connected to each other as an output end of the inverter, and the output end of the inverter is configured to output the pull-down control signal.

In an embodiment of the present disclosure, a control end of the first pull-down switch and a control end of the second pull-down switch are connected to the inverter and configured to receive the pull-down control signal outputted from the inverter.

In an embodiment of the present disclosure, an input end of the pull-up control switch is configured to receive the scan driving signal of the previous GOA unit, a control end of the pull-up control switch is configured to receive a first clock signal, and an output end of the pull-up control switch is configured to output the switch control signal.

In an embodiment of the present disclosure, an output end of the pull-up switch and a control end of the pull-up switch are connected to two ends of the bootstrap capacitor respectively.

A gate on array (GOA) circuit comprising a plurality of cascaded GOA units, wherein each of the GOA units comprises:

A pull-up control circuit configured to receive a scan driving signal of a previous GOA unit and configured to output a switch control signal.

A pull-up circuit configured to receive the switch control signal and configured to output a scan driving signal of a present GOA unit according to the switch control signal.

A pull-down circuit configured to receive a pull-down control signal and configured to pull-down a voltage potential of the scan driving signal of the present GOA unit to a low voltage potential.

An inverter, wherein a voltage potential of an output signal of the inverter is inversed of a voltage potential of an input signal of the inverter.

A bootstrap capacitor configured to pull-up and maintain a voltage potential of the switch control signal.

Wherein some of or all of the TFTs in the pull-up control circuit, in the pull-up circuit, in the pull-down circuit, and in the inverter are dual gate TFTs, and a bottom gate of the dual gate TFT is connected to an external voltage for controlling a threshold voltage of the dual gate TFT.

In an embodiment of the present disclosure, the inverter comprises a first thin-film transistor (TFT) and a second TFT; an input end of the first TFT is connected to an low voltage potential and a control end of the first TFT is connected to the switch control signal.

An input end of the second TFT and a control end of the second TFT are connected to a high voltage potential.

In an embodiment of the present disclosure, a control end of the first TFT is an input end of the inverter, an output end of the first TFT, and an output end of the second TFT are connected to each other as an output end of the inverter, and the output end of the inverter is configured to output the pull-down control signal.

In an embodiment of the present disclosure, the pull-up control circuit comprises a pull-up control switch, an input end of the pull-up control switch is configured to receive the scan driving signal of the previous GOA unit, a control end of the pull-up control switch is configured to receive a first clock signal, and an output end of the pull-up control switch is configured to output the switch control signal.

In an embodiment of the present disclosure, the pull-up circuit comprises a pull-up switch connected to the pull-up control circuit; a control end of the pull-up switch is configured to receive the switch control signal, a input end of the pull-up is configured to receive a second clock signal, and an output end of the pull-up switch output the scan driving signal of the present GOA unit; wherein waves of the first clock signal of the second clock signal are inversed.

In an embodiment of the present disclosure, an output end of the pull-up switch and a control end of the pull-up switch are connected to two ends of the bootstrap capacitor respectively.

In an embodiment of the present disclosure, the pull-down circuit comprises a first pull-down switch and a second pull-down switch; an input end of the first pull-down switch and an input end of the second pull-down switch is configured to receive a low voltage potential.

In an embodiment of the present disclosure, a control end of the first pull-down switch and a control end of the second pull-down switch are connected to the inverter and configured to receive the pull-down control signal outputted from the inverter.

In an embodiment of the present disclosure, the first TFT is a dual gate TFT, and a bottom gate of the dual gate TFT is connected to an external voltage for controlling a threshold voltage of the dual gate TFT.

In an embodiment of the present disclosure, the pull-up control switch is a dual gate TFT, and a bottom gate of the dual gate TFT is connected to an external voltage for controlling a threshold voltage of the dual gate TFT.

In an embodiment of the present disclosure, the pull-up switch is a dual gate TFT, and a bottom gate of the dual gate TFT is connected to an external voltage for controlling a threshold voltage of the dual gate TFT.

In an embodiment of the present disclosure, the first pull-down switch and the second pull-down switch are dual gate TFTs, and bottom gates of the dual gate TFTs are connected to external voltages for controlling threshold voltages of the dual gate TFTs.

In an embodiment of the present disclosure, a ratio of a width of the first TFT to a length of the first TFT is larger than a ratio of width of the second TFT to a length of the second TFT.

An array substrate comprising a gate on array (GOA) circuit, the gate on array (GOA) circuit comprising a plurality of cascaded GOA units, wherein each of the GOA units comprises:

A pull-up control circuit configured to receive a scan driving signal of a previous GOA unit and configured to output a switch control signal.

A pull-up circuit configured to receive the switch control signal and configured to output a scan driving signal of a present GOA unit according to the switch control signal.

A pull-down circuit configured to receive a pull-down control signal and configured to pull-down a voltage potential of the scan driving signal of the present GOA unit to a low voltage potential.

An inverter, wherein a voltage potential of an output signal of the inverter is inversed of a voltage potential of an input signal of the inverter.

A bootstrap capacitor configured to pull-up and maintain a voltage potential of the switch control signal.

Wherein some of or all of the TFTs in the pull-up control circuit, in the pull-up circuit, in the pull-down circuit, and in the inverter are dual gate TFTs, and a bottom gate of the dual gate TFT is connected to an external voltage for controlling a threshold voltage of the dual gate TFT.

Beneficial Effect

The GOA circuit provided by the present disclosure utilizes dual gate TFT to adjust the threshold voltages of components, to implement control of threshold voltage, to ensure the stability of the GOA circuit, and to prolong the life of the array substrate. In the meanwhile, the GOA circuit of the present disclosure adopts only 6 TFTs so that the circuit structure is implied and narrow bezel is achieved.

DETAILED DESCRIPTION OF PREFERRED EMBODIMENTS

The following description of the various embodiments is provided to illustrate the specific embodiments of the present disclosure. Directional terms mentioned in the present disclosure, such as upper, lower, front, back, left, right, inside, outside, lateral, etc., are merely references the direction of the attach drawing. Therefore, the directional terms is used in the purpose of illustration and understanding of the present disclosure. In the figures, structurally similar elements are numbered by the same reference numbers.

The present disclosure desire to solve the technical difficulty of narrower bezel resulted from threshold voltage drifting and plenty number of thin-film transistors (TFTs) in the present gate on array (GOA) circuit. The present disclosure can solve these disadvantages.

The present disclosure provides a GOA circuit includes a plurality of cascaded GOA units. The following will take a (n)th stage of GOA unit as an example.

Figure 1:
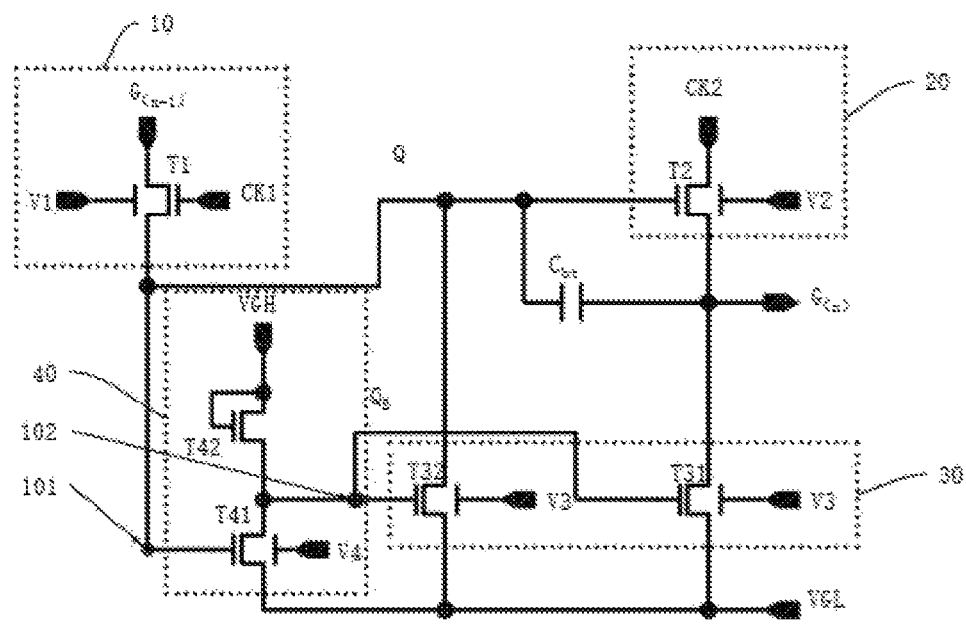
FIG. 1 illustrates a structure of a gate on array (GOA) circuit of an embodiment of the present disclosure.

As shown in FIG. 1. The GOA unit includes a pull-up control circuit 10, a pull-up circuit 20, a pull-down circuit 30, an inverter 40, and a bootstrap capacitor Cbt.

The pull-up control circuit 10 receives a scan driving signal of a previous GOA unit G(n−1) and outputs a switch control signal Q.

The pull-up circuit 20 receives the switch control signal Q and outputs a scan driving signal of a present GOA unit G(n) according to the switch control signal Q.

The pull-down circuit 30 receives a pull-down control signal QB and pulls a voltage potential of the scan driving signal of the present GOA unit G(n) down to a low voltage potential according to the switch control signal Q.

A voltage potential of an output signal of the inverter 10 is inversed to a voltage potential of an input signal of the inverter 40.

A bootstrap capacitor Cbt maintains a voltage potential of the switch control signal Q.

some of or all of the TFTs in the pull-up control circuit 10, in the pull-up circuit 20, in the pull-down circuit 30, and in the inverter 40 are dual gate TFTs. A bottom gate of the dual gate TFT is connected to an external voltage for controlling a threshold voltage of the dual gate TFT In this embodiment, the pull-up control circuit 10 includes a pull-up control switch T1. The pull-up circuit 20 includes a pull-up switch T2. The pull-down circuit 30 includes a first pull-down switch T31 and a second pull-down T32. The inverter 40 includes a first TFT T41 and a second TFT T42.

The first pull-up control switch T1, the pull-up switch T2, and the first pull-down switch T331, the second pull-down switch T32, and the first TFT T41 are dual gate TFTs. Basically, the second TFT T42 is not affected by voltage. A drift of a threshold voltage of the second TFT T42 is regardless. Thus, the second TFT T 42 is not necessary to adopt dual data TFT. The other 5 TFTs add bottom gates in order to control threshold voltages. Because different TFTs endure difference voltages, if applying different bottom gate voltages to the TFTs, (for example, the first pull-up switch T1 is affected by under 50% of a gate voltage duty ratio, the pull-up switch T2 is affected by its source-drain voltage, the first pull-down switch T31 and the second pull-down switch T32, whose threshold voltages drift are similar, are affected by gate voltages, and the first TFT T41 is affected by a gate voltage), then the individual control of threshold voltages of each of the TFT can be implemented.

Figure 2:
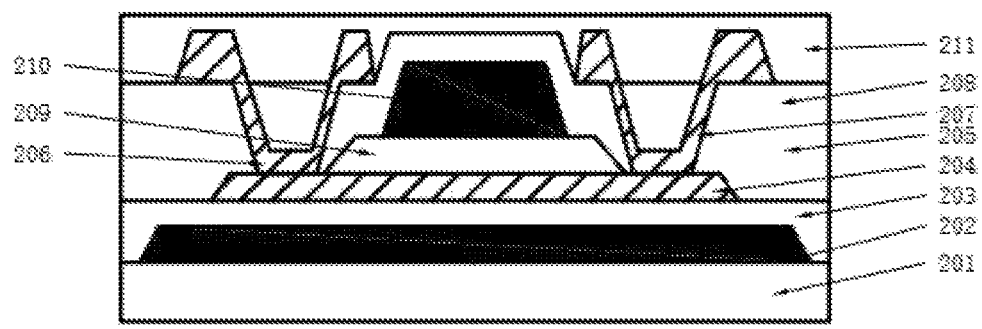
FIG. 2 illustrates a cross-sectional structure of a thin-film transistor (TFT) of the embodiment of the present disclosure.

A cross-sectional view of dual gate TFT is shown as FIG. 2 which includes substrate 201 and each components of TFT. A bottom gate 202 is disposed on the substrate 201. A bottom gate insulation layer 203 is disposed on the bottom gate 202 and covers the bottom gate 202. An active layer 204 is disposed on the bottom gate insulation layer 203. There are a top gate insulation layer 209 and a top gate 210 disposed on the active layer 204. The top gate insulation layer 209 is disposed between the active layer 204 and the top gate 210. There are a source 206 and a source 207 laterally disposed on two side of the active layer 204 respectively. An internal insulation layer 208 covers the active layer 204, the top gate insulation layer 209, parts of the source 206, and parts of the source 207. The other part of the source 206 and the source 207 penetrate through the internal insulation layer 208 and are disposed on the internal insulation layer 208. A passivation layer 211 is disposed on the internal insulation layer 208. The passivation layer 211 covers the other part of the source 206 and the source 207 penetrating through the internal insulation layer 208.

Figure 3:
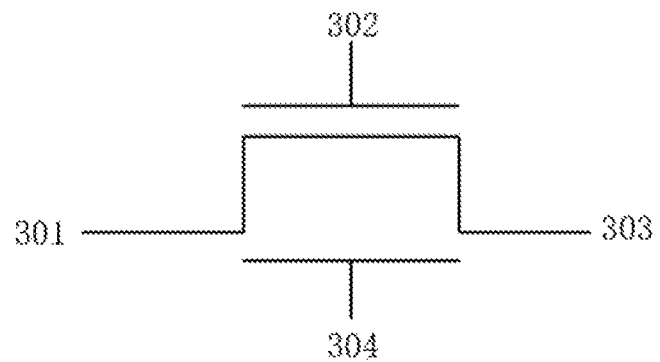
FIG. 3 illustrates a circuit structure of the thin-film transistor (TFT) of the embodiment of the present disclosure.

A circuit structure of the dual gate TFT is shown in FIG. 3. The dual gate TFT includes a receive end 301, a control end 302, an output end 303, and an external voltage end 304. The control end 302 is the top gate of the dual gate TFT. The external voltage end is the bottom of the dual gate TFT.

It should be notice that the control end of the TFT is configured to control whether the TFT should be turned on or not. When the control end of the TFT receives high voltage signal, the TFT is turned on and signal received by the receive end is outputted from the output end.

Figure 4A:
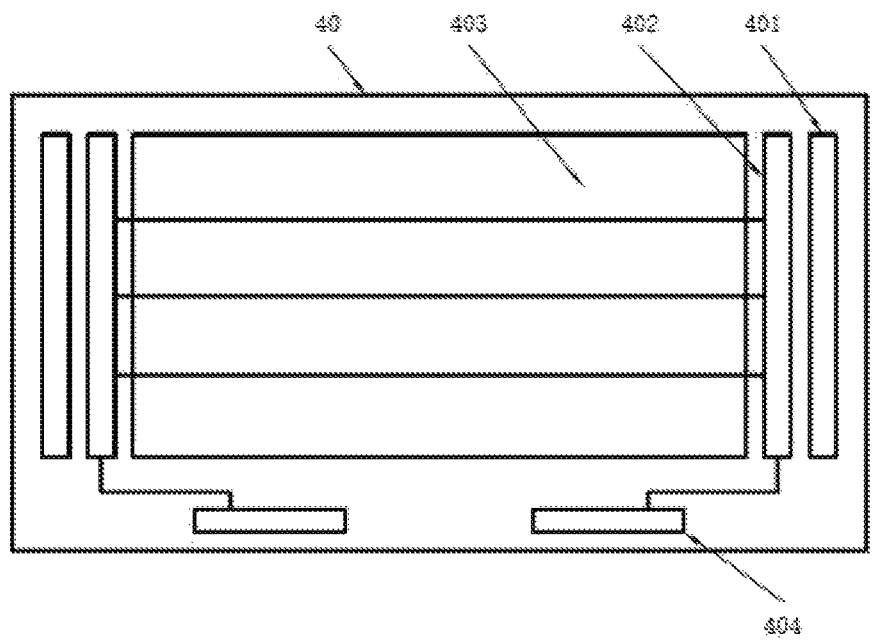
FIG. 4a illustrates an arrangement of a panel of the embodiment of the present disclosure.
Figure 4B:
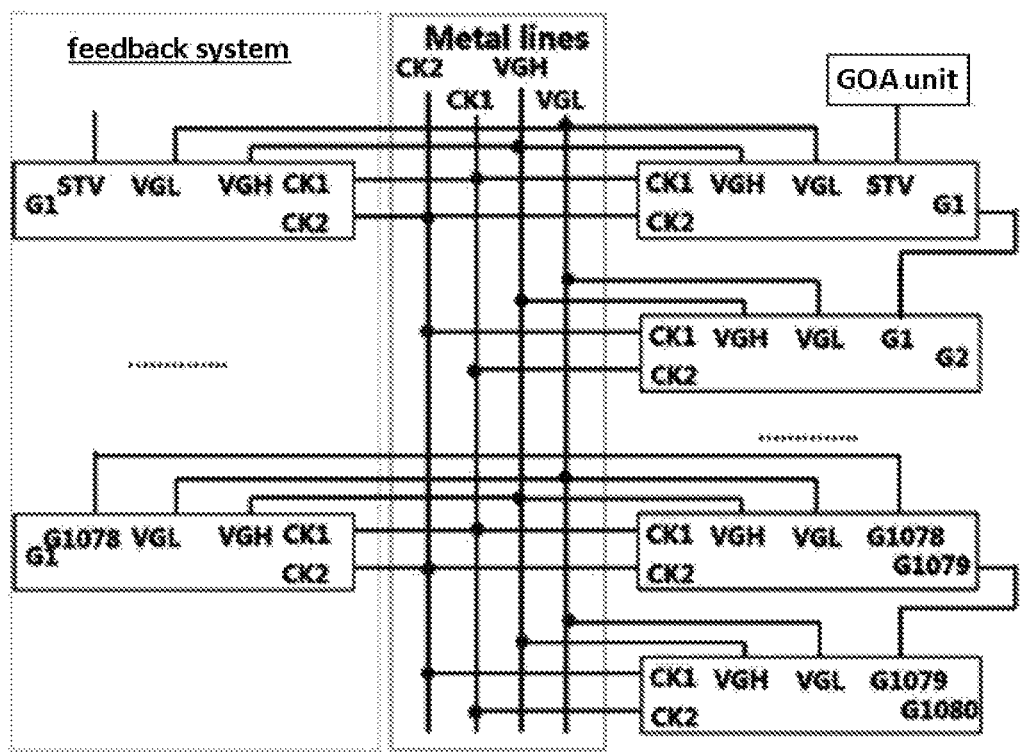
FIG. 4b illustrates a feedback system of the GOA circuit of the embodiment of the present disclosure.
Figure 4C:
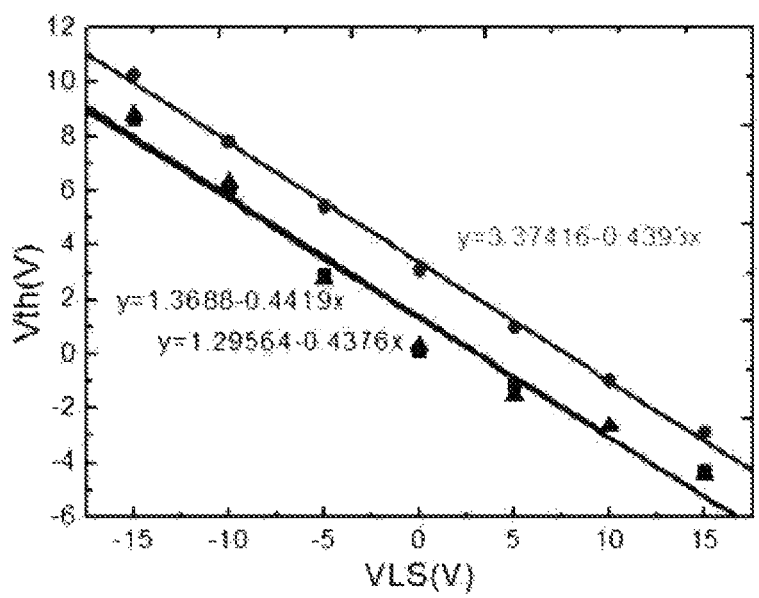
FIG. 4c illustrates a relative curve diagram of an external voltage connected to a bottom gate of the TFT and a threshold voltage of the GOA circuit of the embodiment of the present disclosure.

In addition, FIG. 4c shows a performance curve of the external voltage connected the bottom gate of the dual gate TFT regarding to a characteristic of the TFT of the present disclosure. The x-axis represents the external voltage. The y-axis presents the threshold voltage. As shown in figure, the more positive the bottom gate voltage is, the more negative the threshold voltage of the TFT is. The more negative the bottom gate voltage is, the more positive the threshold voltage of the TFT is. The bottom gate voltage can adjust the threshold voltage of the TFT according to the above-mentioned relation.

Therefore, the present disclosure adjusts the bottom gate voltage through a feedback system. FIG. 4a illustrates an arrangement of panel 40 of the present disclosure. The GOA circuits 402 are laterally disposed on two side of the panel 40. The feedback systems 401 are disposed outer the lateral GOA circuits 402. A wire area 403 locates at central area. A chip on file (COF) 404 is disposed under the panel 40.

FIG. 4b illustrates a structure of the feedback system of the present disclosure. The feedback system chooses some of the GOA units as feedback units. The chosen GOA units are utilized to make arrangement structures of the feedback units being the same as the arrangement structures of cascaded stages of GOA units. In addition, signals applied on three terminals of the TFTs in feedback units, i.e. feedback TFTs, are the same the signals applied on three terminals of the TFTs in GOA units. Therefore, electric characteristics of the TFTs in the feedback TFTs are the same as electric characteristics of TFTs of cascaded stages GOA, Therefore, the threshold voltages of TFTs can be obtained by measuring electric signals of feedback TFTs. Then, the bottom gate voltages of TFTs are adjusted in order to make the GOA circuits output narrow pulses and wide pulses. The bottom gate voltages are adjustable with time according to periodically measured data, established data base, and predetermined processes.

The feedback system is cut off according to electric signals detected by the feedback system in the purpose of narrowing the bezel.

The following will take FIG. 1 as example to describe the structure and performance of GOA circuits in detail.

As shown in FIG. 1. The pull-up control circuit 10 includes the pull-up control switch T1. The pull-up control switch T1 is a dual gate TFT. The input end of the pull-up control switch receives the scan signal of previous stage of GOA unit. The control end, i.e. top gate, receives the first clock signal CK1. The bottom gate receives an external voltage V1. Thus, the threshold voltage of TFT can be adjusted. The output end of the pull-up control switch T1 outputs switch control signal Q.

The pull-up circuit includes the pull-up switch T2. The pull-up switch T2 is a dual TFT. The input end of the pull-up switch T2 receives the first clock CK1 and the second clock signal CK2 being inversed to the first clock CK1. The control end, i.e. top gate, is connected to the pull-up control circuit 10 for receiving the switch control signal Q outputted from the pull-up control circuit. The output end of the pull-up switch T2 outputs the scan signal of the present stage of GOA unit G(n). In the meanwhile, the bottom gate of the pull-up switch receives an external voltage V2 for adjusting the threshold voltage of the TFT.

Two ends of the bootstrap capacitor Cbt are coupled to the control end of the pull-up switch T2 and the output end of the pull-up switch T2. The bootstrap capacitor Cbt is utilized for maintaining and pulling up the voltage potential of the switch control signal.

The pull-down circuit 30 includes the first pull-down switch T31 and the second pull-down switch T32. The first pull-down switch T31 and the second pull-down switch T32 are dual gate TFT. The bottom gate of the first pull-down switch T31 and the second pull-down switch T32 receive an external voltage V3 for adjusting the threshold voltages of the TFTs.

The input end of the first pull-down switch T31 receives a low voltage VGL. The output end of the first pull-down switch receives scan signal of the present stage G(n). The control end of the first pull-down switch receives pull-down control signal QB outputted from the inverter 40. The input end of the second pull-down switch T32 also receives a low voltage VGL. The output end of the second pull-down switch is connected to the switch control signal Q. The control end of the second pull-down switch receives the pull-down control signal QB outputted from the inverter 40.

The inverter 40 includes the first TFT T41 and the second TFT T42. However, only the first TFT T41 is dual gate TFT. The bottom gate of the first TFT receives an external voltage V4 for adjusting the threshold voltage of the TFT. Because the second TFT T42 is not affected, the threshold voltage of the second TFT T42 does not drift. Thus, the second TFT T42 does not required bottom gate.

The input end of the first TFT T41 is connected to the low voltage VGL. The control end of the first TFT is connected to the switch control signal Q. The control end of the first TFT is the input end 101 of the inverter 40. The input end 101 receives the switch control signal Q. Both of the input end of the second TFT T42 and the control end of the second TFT T42 are connected to a high voltage VGH. In the meanwhile, the output end of the first TFT T41 is connected to the output end of the second TFT T42 for being an output end 102 of the inverter 40. The output end 102 outputs pull-down control signal QB.

When the switch control signal Q received by the input end 101 is at high voltage potential, the pull-down control signal QB outputted by the output end 102 is at low voltage potential. When the switch control signal Q received by the input end 101 is at low voltage potential, the pull-down control signal QB outputted by the output end 102 is at high voltage potential.

The operation of the inverter 40 is as following. The first TFT T41 and the second TFT T42 output the output signal of the inverter 40. Because the capacity of the first TFT T41 is greatly larger than the capacity of the second TFT T42, when the first TFT T41 is turned on, the voltage potential of the pull-down control signal QB is manly affected by the first TFT T41. When the first TFT T41 is turned off, the voltage potential of the pull-down control signal QB is manly affected by the second TFT T42.

Figure 5:
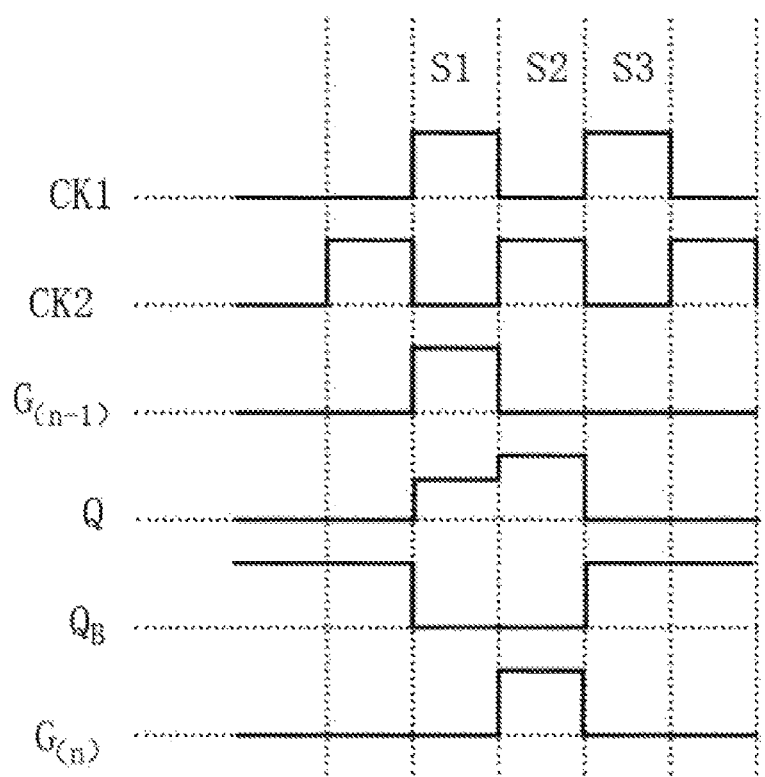
FIG. 5 illustrates waveforms of signals of a GOA unit of the embodiment of the present disclosure.

FIG. 5 illustrates the signal waveforms of the GOA units of the present disclosure. The following analysis is described with GOA circuit of FIG. 1.

In period S1: The first clock CK1 received by the control end of the pull-up control switch T1 is at high voltage potential. The pull-up control switch T1 is turned on. The scan signal of the previous stages of GOA unit G(n−1) received by the input end of the pull-up control switch is at high voltage potential. The switch control signal Q outputted by the output end of the pull-up control switch T1 is at high voltage potential. Therefore, the bootstrap capacitor Cbt starts to be charged.

The switch control signal Q received by the control end of the pull-up switch T2 is at high voltage potential. The pull-up switch T2 is turned on. The second clock signal CK2 received by the input end of the pull-up switch T2 is at low voltage potential. The scan signal of the present stage of GOA unit G(n) outputted by the output end of the pull-up switch T2 is at low voltage potential.

The switch control signal Q received by the control end of the first TFT T41 is at high voltage potential. That is, the signal received by the input end 101 of the inverter 40 is at high voltage potential. Thus, the pull-down control signal QB outputted by the input end 102 of the inverter 40 is at low voltage potential.

The control end of the first pull-down switch T31 and the control end of the second pull-down switch receives the pull-down control signal QB. Thus, the first pull-down switch T31 and the second pull-down switch T32 are turned off.

In period S2: The first clock CK1 received by the control end of the pull-up control switch T1 is at low voltage potential. The pull-up control switch T1 is turned off.

The bootstrap capacitor Cbt completes charging. The switch control signal Q is charged to higher voltage potential due to being coupled by the bootstrap capacitor Cbt.

The switch control signal Q received by the control end of the pull-up switch T2 is at high voltage potential. The pull-up switch T2 is turned on. The second clock signal CK2 received by the input end of the pull-up switch T2 is at high voltage potential. The scan signal of the present stage of GOA unit G(n) outputted by the output end of the pull-up switch T2 is at high voltage potential.

The switch control signal Q received by the control end of the first TFT T41 is at high voltage potential. That is, the signal received by the input end 101 of the inverter 40 is at high voltage potential. Thus, the pull-down control signal QB outputted by the input end 102 of the inverter 40 is at low voltage potential. Thus, the first pull-down switch T31 and the second pull-down switch T32 are turned off.

In period S3: The first clock CK1 received by the control end of the pull-up control switch T1 is at high voltage potential. The pull-up control switch is turned on. The scan signal of the previous stages of GOA unit G(n−1) is low high voltage potential. The switch control signal Q outputted by the output end of the pull-up control switch T1 is at low voltage potential.

The switch control signal Q received by the control end of the pull-up switch T2 is low voltage potential. The pull-up switch T2 is turned off.

The switch control signal Q received by the control end of the first TFT T41 is at low voltage potential. That is, the signal received by the input end 101 of the inverter 40 is at low voltage potential. Thus, the pull-down control signal QB outputted by the input end 102 of the inverter 40 is at high voltage potential.

The pull-down control signal QB received by both of the control end of the first pull-down switch T31 and the control end of the second pull-down switch is at high voltage potential. Thus, the first pull-down switch T31 and the second pull-down switch T32 are turned on. Both of the input ends of T31 and T32 receive the low voltage VGL. The scan signal G(n) connected to the output end of the first pull-down switch T31 is at low voltage potential. The switch control signal Q connected to the output end of the second pull-down switch T32 is at low voltage potential To conclude, the GOA circuit provided by the present disclosure adopts dual gate TFTs as circuit switches in order to ensure the stability of the GOA circuit. The yield of the array substrate is enhanced. The feedback systems disposed on two side of the panel can be removed after testing. Therefore, the bezel of the panel can be narrowed.

The GOA circuit provided by the present disclosure utilizes dual gate TFTs to adjust the threshold voltages of dual gate TFTs. Therefore, the threshold voltages are controllable, the stability of the GOA circuit is ensured, and the life of the array substrate is prolonged. In the meanwhile, the GOA circuit of the present disclosure adopts only 6 TFTs. The circuit structure is simpler. Thus, narrower bezel of the panel can be implemented.

To conclude, although the present disclosure has been disclosed by the above-mentioned preferred embodiments, the preferred embodiments are not limitation of the present disclosure. Variations and modifications can be obtained without departing from the aspect and scope of the present disclosure by a skilled person in the art. Therefore, the protected scope of the present disclosure is subject to the scope defined by the claims.

What is claimed is:

1. A gate on array (GOA) circuit comprising a plurality of cascaded GOA units, wherein each of the GOA units comprises:
   a pull-up control circuit configured to receive a scan driving signal of a previous GOA unit and configured to output a switch control signal, wherein the pull-up control circuit comprises a pull-up control switch;
   a pull-up circuit configured to receive the switch control signal and configured to output a scan driving signal of a present GOA unit according to the switch control signal, wherein the pull-up circuit comprises a pull-up switch;
   a pull-down circuit configured to receive a pull-down control signal and configured to pull-down a voltage potential of the scan driving signal of the present GOA unit to a low voltage potential, wherein the pull-down circuit comprises a first pull-down switch and a second pull-down switch;
   an inverter comprising a first thin-film transistor (TFT) and a second TFT, a voltage potential of an output signal of the inverter is inversed of a voltage potential of an input signal of the inverter;
   a bootstrap capacitor configured to pull-up and maintain a voltage potential of the switch control signal;
   wherein some of or all of the TFTs in the pull-up control circuit, in the pull-up circuit, in the pull-down circuit, and in the inverter are dual gate TFTs, and a bottom gate of the dual gate TFT is connected to an external voltage for controlling a threshold voltage of the dual gate TFT;
   when a some of the TFTs are the dual gate TFTs, the pull-up control switch, the pull-up switch, the first pull-down switch, the second pull-down switch, and the first TFT each are the dual gate TFTs.

2. The GOA circuit according to claim 1, wherein a ratio of a width of the first TFT to a length of the first TFT is larger than a ratio of width of the second TFT to a length of the second TFT.

3. The GOA circuit according to claim 1, wherein an input end of the pull-up control switch is configured to receive the scan driving signal of the previous GOA unit, a control end of the pull-up control switch is configured to receive a first clock signal, and an output end of the pull-up control switch is configured to output the switch control signal.

4. The GOA circuit according to claim 1, wherein an output end of the pull-up switch and a control end of the pull-up switch are connected to two ends of the bootstrap capacitor respectively.

5. The GOA circuit according to claim 1, wherein a control end of the first TFT is an input end of the inverter, an output end of the first TFT, and an output end of the second TFT are connected to each other as an output end of the inverter, and the output end of the inverter is configured to output the pull-down control signal.

6. The GOA circuit according to claim 5, wherein a control end of the first pull-down switch and a control end of the second pull-down switch are connected to the inverter and configured to receive the pull-down control signal outputted from the inverter.

7. A gate on array (GOA) circuit comprising a plurality of cascaded GOA units, wherein each of the GOA units comprises:
   a pull-up control circuit configured to receive a scan driving signal of a previous GOA unit and configured to output a switch control signal;
   a pull-up circuit configured to receive the switch control signal and configured to output a scan driving signal of a present GOA unit according to the switch control signal;
   a pull-down circuit configured to receive a pull-down control signal and configured to pull-down a voltage potential of the scan driving signal of the present GOA unit to a low voltage potential;
   an inverter, wherein a voltage potential of an output signal of the inverter is inversed of a voltage potential of an input signal of the inverter;
   a bootstrap capacitor configured to pull-up and maintain a voltage potential of the switch control signal;
   wherein some of or all of the TFTs in the pull-up control circuit, in the pull-up circuit, in the pull-down circuit, and in the inverter are dual gate TFTs, and a bottom gate of the dual gate TFT is connected to an external voltage for controlling a threshold voltage of the dual gate TFT.

8. The GOA circuit according to claim 7, wherein a ratio of a width of the first TFT to a length of the first TFT is larger than a ratio of width of the second TFT to a length of the second TFT.

9. The Goa circuit according to claim 7, wherein the inverter comprises a first thin-film transistor (TFT) and a second TFT; an input end of the first TFT is connected to an low voltage potential and a control end of the first TFT is connected to the switch control signal;
   an input end of the second TFT and a control end of the second TFT are connected to a high voltage potential.

10. The GOA circuit according to claim 9, wherein a control end of the first TFT is an input end of the inverter, an output end of the first TFT, and an output end of the second TFT are connected to each other as an output end of the inverter, and the output end of the inverter is configured to output the pull-down control signal.

11. The GOA circuit according to claim 9, wherein the first TFT is a dual gate TFT, and a bottom gate of the dual gate TFT is connected to an external voltage for controlling a threshold voltage of the dual gate TFT.

12. The GOA circuit according to claim 7, wherein the pull-down circuit comprises a first pull-down switch and a second pull-down switch; an input end of the first pull-down switch and an input end of the second pull-down switch is configured to receive a low voltage potential.

13. The GOA circuit according to claim 12, wherein a control end of the first pull-down switch and a control end of the second pull-down switch are connected to the inverter and configured to receive the pull-down control signal outputted from the inverter.

14. The GOA circuit according to claim 12, wherein the first pull-down switch and the second pull-down switch are dual gate TFTs, and bottom gates of the dual gate TFTs are connected to external voltages for controlling threshold voltages of the dual gate TFTs.

15. The GOA circuit according to claim 7, wherein the pull-up control circuit comprises a pull-up control switch, an input end of the pull-up control switch is configured to receive the scan driving signal of the previous GOA unit, a control end of the pull-up control switch is configured to receive a first clock signal, and an output end of the pull-up control switch is configured to output the switch control signal.

16. The GOA circuit according to claim 15, wherein the pull-up control switch is a dual gate TFT, and a bottom gate of the dual gate TFT is connected to an external voltage for controlling a threshold voltage of the dual gate TFT.

17. The GOA circuit according to claim 15, wherein the pull-up circuit comprises a pull-up switch connected to the pull-up control circuit; a control end of the pull-up switch is configured to receive the switch control signal, a input end of the pull-up is configured to receive a second clock signal, and an output end of the pull-up switch output the scan driving signal of the present GOA unit; wherein waves of the first clock signal of the second clock signal are inversed.

18. The GOA circuit according to claim 17, wherein an output end of the pull-up switch and a control end of the pull-up switch are connected to two ends of the bootstrap capacitor respectively.

19. The GOA circuit according to claim 17, wherein the pull-up switch is a dual gate TFT, and a bottom gate of the dual gate TFT is connected to an external voltage for controlling a threshold voltage of the dual gate TFT.

20. An array substrate comprising a gate on array (GOA) circuit, the gate on array (GOA) circuit comprising a plurality of cascaded GOA units, wherein each of the GOA units comprises:
    a pull-up control circuit configured to receive a scan driving signal of a previous GOA unit and configured to output a switch control signal;
    a pull-up circuit configured to receive the switch control signal and configured to output a scan driving signal of a present GOA unit according to the switch control signal;
    a pull-down circuit configured to receive a pull-down control signal and configured to pull-down a voltage potential of the scan driving signal of the present GOA unit to a low voltage potential;
    an inverter, wherein a voltage potential of an output signal of the inverter is inversed of a voltage potential of an input signal of the inverter;
    a bootstrap capacitor configured to pull-up and maintain a voltage potential of the switch control signal;
    wherein some of or all of the TFTs in the pull-up control circuit, in the pull-up circuit, in the pull-down circuit, and in the inverter are dual gate TFTs, and a bottom gate of the dual gate TFT is connected to an external voltage for controlling a threshold voltage of the dual gate TFT.

* * * * *